US009503213B2

United States Patent
Grankin et al.

(10) Patent No.: US 9,503,213 B2
(45) Date of Patent: Nov. 22, 2016

(54) SYSTEMS AND METHODS FOR DATA RATE OPTIMIZATION IN A WCAN SYSTEM WITH INJECTION-LOCKED CLOCKING

(71) Applicant: Intel Corporation, Santa Clara, CA (US)

(72) Inventors: Maksim Grankin, Saint-Petersburg (RU); Eugine Bakin, Saint-Petersburg (RU); Andrey Turlikov, Saint-Petersburg (RU)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,499

(22) PCT Filed: Dec. 24, 2012

(86) PCT No.: PCT/IB2012/003091
§ 371 (c)(1),
(2) Date: Jul. 3, 2014

(87) PCT Pub. No.: WO2014/102566
PCT Pub. Date: Jul. 3, 2014

(65) Prior Publication Data
US 2014/0369323 A1    Dec. 18, 2014

(51) Int. Cl.
*H04L 1/00* (2006.01)
*H04W 28/06* (2009.01)
(Continued)

(52) U.S. Cl.
CPC .............. *H04L 1/0002* (2013.01); *G06F 1/00* (2013.01); *H03L 7/00* (2013.01); *H04B 17/21* (2015.01);
(Continued)

(58) Field of Classification Search
CPC ... H04L 1/0002; H04L 1/203; H04L 7/0276; H04W 28/06; H04W 56/001; H04B 17/21
See application file for complete search history.

(56) References Cited

U.S. PATENT DOCUMENTS

2010/0040168 A1  2/2010  Fujita et al.
2011/0169541 A1  7/2011  Steinmann et al.

FOREIGN PATENT DOCUMENTS

EP    2 360 844 A1   8/2011
SU      802913 A1    2/1981

OTHER PUBLICATIONS

Changhui Hu, Lingli Xia and Patrick Chiang (2011). Transmitter Multi-Path Equalization and Receiver Pulse-Injection Locking Synchronization for Short-Range, Ultrawideband Impulse Radio Communications, Ultra Wideband Communications: Novel Trends—System, Architecture and Implementation, Dr. Mohammad Matin (Ed.), ISBN: 978-953-307-461-0, InTech.*

(Continued)

*Primary Examiner* — Jackie Zuniga Abad
(74) *Attorney, Agent, or Firm* — SLGIP

(57) ABSTRACT

A method for determining an optimal pulse repetition period (PRP) in a system including a wireless transmission device operating in a static physical transmission environment includes providing a first and second injection-locked transmission system (ILT system). The method further includes implementing an algorithm in a microprocessor within the first ILT system. The algorithm includes synchronizing a receiver clock in the second ILT system with the clock of the first ILT system; setting the PRP equal to an impulse duration, the PRP being very short; increasing the PRP until a bit error rate (BER) at the PRP is less than the bit error rate limit; and based on the determining that the BER is less than the bit error rate limit, setting the PRP as the optimal PRP.

19 Claims, 7 Drawing Sheets

(51) Int. Cl.
  *H03L 7/00* (2006.01)
  *H04J 3/00* (2006.01)
  *G06F 1/00* (2006.01)
  *H04L 7/027* (2006.01)
  *H04W 56/00* (2009.01)
  *H04B 17/21* (2015.01)
  *H04L 1/20* (2006.01)

(52) U.S. Cl.
  CPC . *H04J 3/00* (2013.01); *H04L 1/00* (2013.01); *H04L 7/0276* (2013.01); *H04W 28/06* (2013.01); *H04W 56/00* (2013.01); *H04W 56/001* (2013.01); *H04L 1/203* (2013.01)

(56) References Cited

OTHER PUBLICATIONS

International Search Report and Written Opinion received for PCT Patent Application No. PCT/IB2012/003091, mailed on Sep. 19, 2013, 6 pages.
Extended European Search report received for European Patent Application No. 12891317.5, mailed on Jul. 8, 2016, 20 pages.

* cited by examiner

SYSTEMS AND METHODS FOR DATA RATE OPTIMIZATION IN A WCAN SYSTEM WITH INJECTION-LOCKED CLOCKING

BACKGROUND

Increasingly, individual chips of a deployed information system include wireless communication ability. WCAN or wireless chip area networks may provide for the communication of various chips within a system without direct wiring.

Wireless inter-chip communication systems using pulse injection-locking for receiver phase synchronization achieve a data rate of 500 Mbps (megabits per second), but exhibit severe multipath interference within a device chassis thereby severely degrading the receiver bit error rate BER at high data-rates due to the inter-symbol interference. There are several solutions of this problem:

Make the pulse repetition period longer than the length of the channel response. However, this significantly reduces the transmission speed to 125 Mbps.

Use transmitter side equalizer (precoder) to reduce only the 2-3 most severe multipath reflections. This complicates the circuit of the transmitter.

Use an equalizer at the receiver. This also significantly complicates the receiver circuit.

All of these proposed solutions have significant disadvantages, either resulting in non-optimal transmission speed or a significantly more complicated circuit.

Therefore, a solution is needed to optimize transmission speed.

BRIEF DESCRIPTION OF THE DRAWINGS

Illustrative embodiments of an injection-locked pulse repetition period optimized system are described in detail below with reference to the attached drawing figures, wherein.

DETAILED DESCRIPTION OF THE DRAWINGS

There are a few ways of increasing data rate in wireless communication systems, but most of them require growth in the complexity of the chips, such as a TX precoder (transmit precoder), RX equalizer (receiver equalizer), an FEC (forward error corrector), etc. Properties of WCAN systems with injection-locked clocking allow it to be done without the complication of integrated circuits. In some embodiments, according to these properties for some systems it is possible to find optimal data rate, instead of using a precoder or equalizer. Embodiments of an injection-locked pulse repetition period optimized system (ILPRPO system) have the following main elements:

Chips are equipped with WCAN transceivers using injection-locked clocking technique.

Channel response is measured beforehand, and channel response is static, which is the usual solution for WCAN systems.

Pulse repetition period is chosen less than channel impulse response duration so that multipath impact is negligible.

The Proposed method gives about 20% data rate gain compared with typical solutions. The ILPRPO system is primarily utilized on chips with WCAN transceivers using injection-locked clocking technique. In alternatives, it can be implemented into any system where the channel response is expected to be static. Systems with a static channel response are typically those where objects that cause interference with the transmission path are stationary.

Figure 1A:
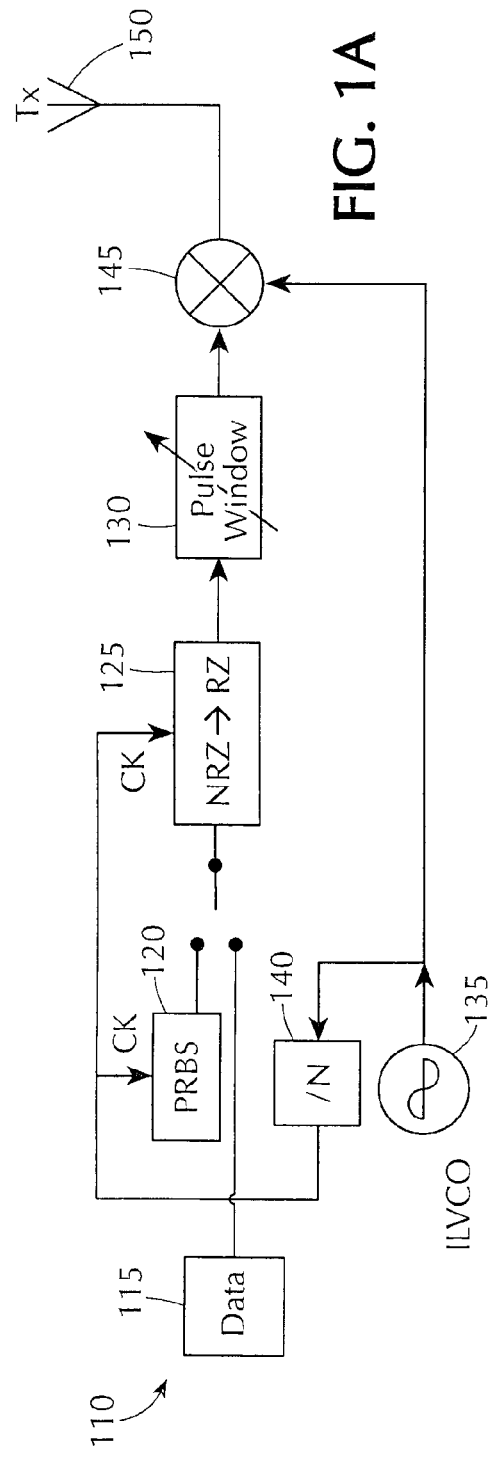
FIGS. 1a and 1b show one embodiment of transmitter and receiver for use with an injection-locked pulse repetition period (ILPRP) optimized system.
Figure 1B:
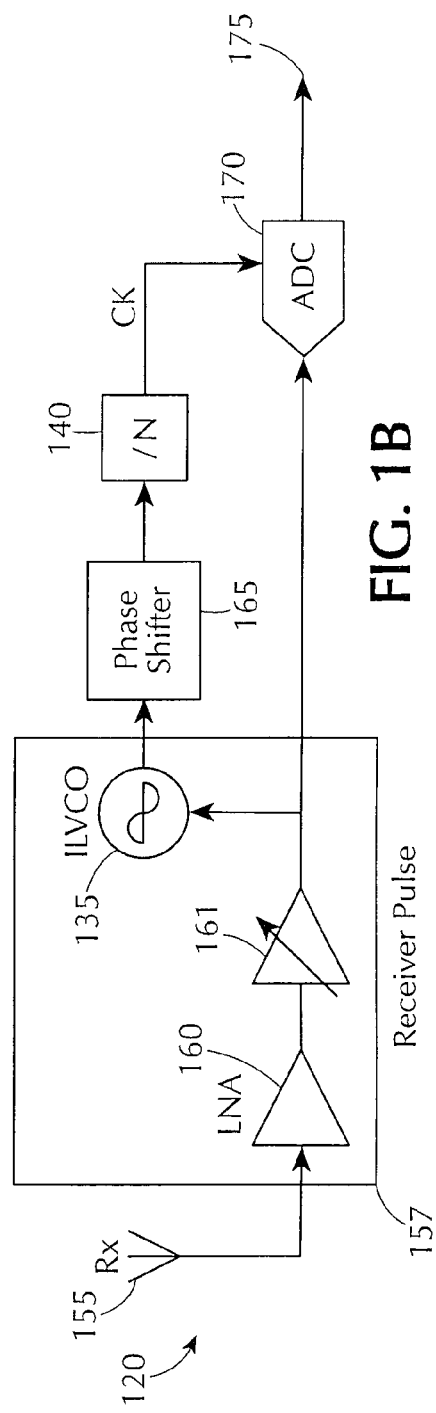

FIGS. 1a and 1b show one embodiment of a transceiver for use with an ILPRPO system. At times this system may be referred to as an ILT system (an injection-locked transmission system). This is because the electronics of the system allow for the injection period of the system to be locked with a receiver. This reduces potential phase shift issues during transmissions. The considered transceiver shown in FIGS. 1a and 1b includes a pulse-injection-locking receiver. The provision of a pulse-injection-locking receiver provides for an energy-efficient scheme of synchronization of the local oscillator with the received signal carrier and clock synchronization of the receiver with the transmitter. This is at least in part because oversampling of the signal is not necessary to avoid phase shifts of transmission signal and sampling. The transmitter 110 portion and the receiver 120 portion of the transceiver are shown. Transmitter 110 includes a data source 115 providing the data to be wirelessly transmitted. The transmitter 110 further includes a pseudo-random binary sequence transmitter 120, a non-return to zero to return to zero data converter 125, a variable pulse window 130, an injection locked voltage control oscillator 135, a frequency divider 140, a combiner 145, and an antenna 150. The receiver 120 includes a receiver antenna 155, a receiver pulse injection locking system 157, including a low noise amplifier 160, a variable amplifier 161, and an injection locked voltage control oscillator 135, a phase shifter 165, a divider 140 and a five level flash analog to digital converter 170. The result of reception, data 175, is returned to a microprocessor. Received pulse is amplified by a two-stage low-noise amplifier (LNA) 160 before being directly injected into both a five-level flash ADC (analog to digital converter) 170 and a 3.4 4.5 GHz, injection-locked VCO (IL-VCO or voltage controlled oscillator) On-off keying (OOK) modulation scheme is chosen due to its simplicity. Although a particular transceiver is shown, other transceivers will be apparent to those skilled in the art in light of this disclosure. In many embodiments, alternative transceivers will have a pulse-injection-locking mechanism. Various configurations will occur to those skilled in the art in light of this disclosure and the above is merely an example.

Figure 2:
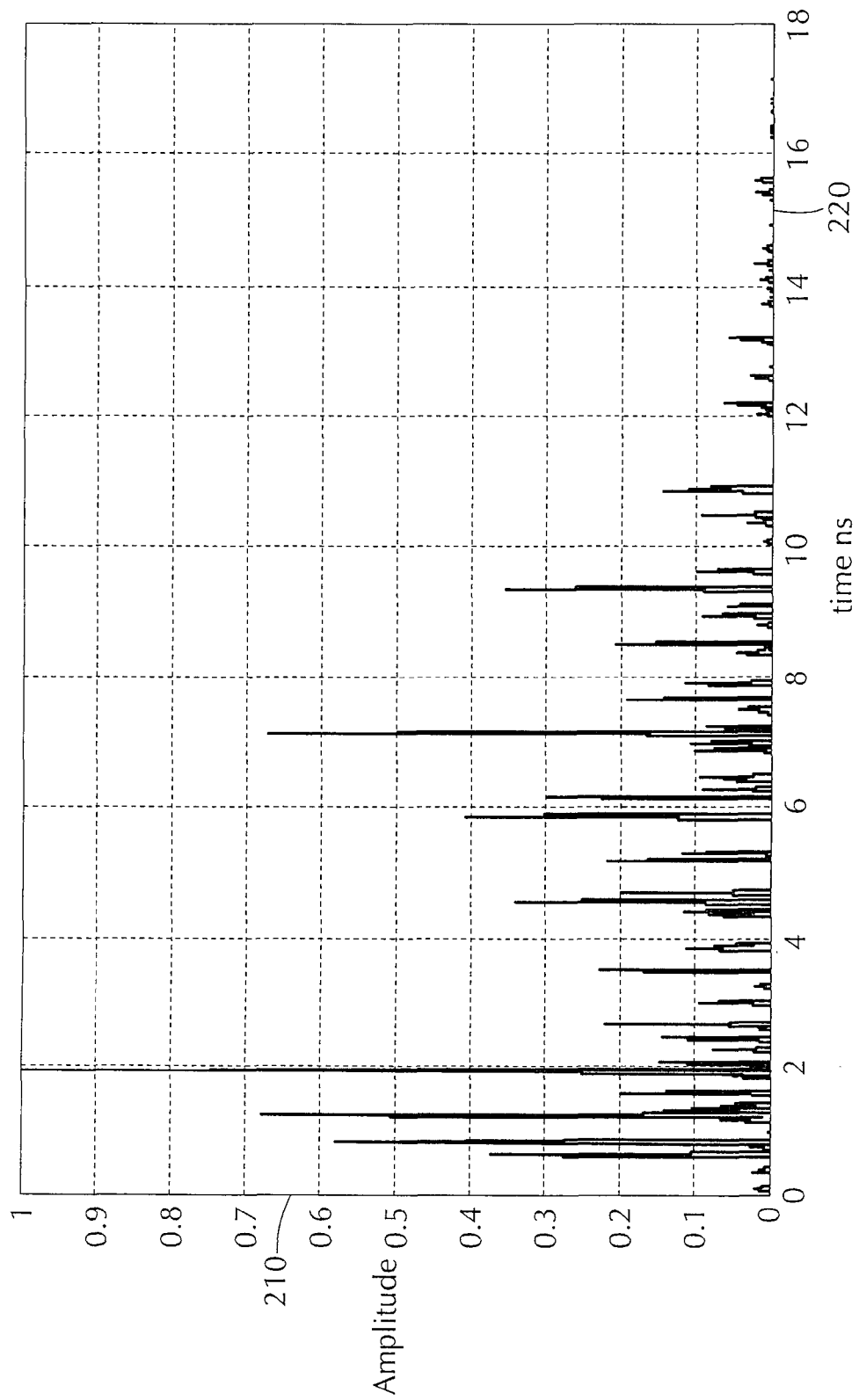
FIG. 2 shows an example of channel response within a computer chassis.

FIG. 2 shows channel response within a computer chassis. The y-axis 210 shows the amplitude of the signal. The x-axis 220 shows the time in nanoseconds of the PRP or pulse repetition period. In typical solutions, pulse repetition period is usually chosen greater than channel response duration. This leads to a significant loss in data rate. For example, the rate drops from 500 Mbps to 125 Mbps (megabits per second) for the typical channel response within an example of a computer chassis given in FIG. 2.

Figure 3:
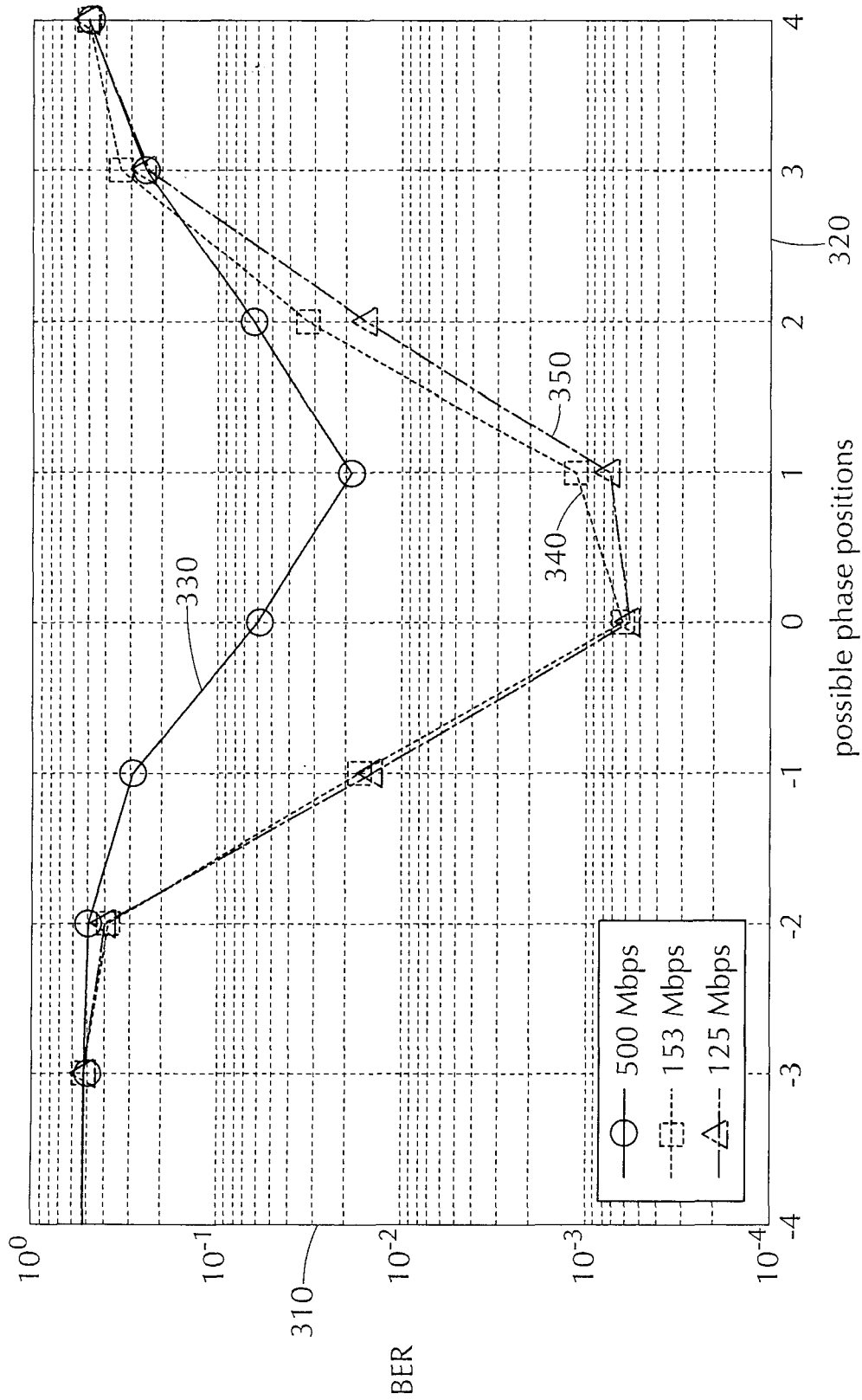
FIG. 3 shows an example of a bath-tub curve of bit error rate (BER) vs. possible phase positions.

FIG. 3 shows a bath-tub curve of bit error rate (BER) vs. possible phase positions. The y-axis 310 denotes the BER on a logarithmic scale. The x-axis 320 shows possible phase positions for the transmission. Line 330 denotes 500 Mbps, line 340 denotes 153 Mbps (the optimal rate in this example), and line 350 denotes 125 Mbps (the conservative default transmission rate that would be chosen in absence of analysis. The optimal phase position of the ADC (analog to digital) sampling clock can be set at startup by measuring the BER by building a bath-tub curve, sweeping through all possible phase positions (see FIG. 3 line 350). Generally, BER is chosen to fit the parameters of the transmission system. If too high of a BER is allowed for, then multiple packets will need to be retransmitted, resulting in a lower effect transmission rate. Various acceptable BER may be possible in disparate systems; the identified BER in the current application is merely an example and other BER may occur to those skilled in the art in light of this disclosure and the specifics of the system used.

Due to the static nature of the environment that in which WCAN systems operate, i.e., those producing a static channel response, they may be configured to measure the channel response beforehand. Knowledge of the main reflectors locations can be used to assist in determining the channel response beforehand. In many configurations, it is possible to choose PRP less than channel impulse response duration so that multipath impact is negligible. Thus a gain of data rate can be achieved. Different systems and configurations will have different acceptable bit rate errors. The acceptable bit error rate is referred to as BERlimit herein. The bit error rate as a function of the pulse repetition period is referred to as BER(PRP) herein. For purposes of example, it is assumed that a BERlimit<10-3 is needed. In such as case, the training method shown in FIG. 4 may be implemented.

As shown, in this embodiment of a training procedure, in procedure 410 the PRP is set equal to impulse duration, the impulse duration being the length of the transmission pulse. This is a very short PRP, since if the PRP is made any shorter, the pulses will overlap. In procedure 420, the system proceeds to pulse injection-locking to synchronize the receiver clock with transmitted data. In procedure 430, a test sequence is passed. In procedure 440, the BER is calculated as a function of the PRP. If BER(PRP)>BERlimit in direction 450, then the PRP is increased in procedure 460 and the system returns to procedure 420. If BER(PRP)<BERlimit in direction 470. Then in procedure 480 the PRP is returned and the training is stopped. Optionally, the algorithm may repeat multiple times so that the three or more PRPs are determined in consecutive order that have BERs less that the limit. Therefore, the procedure of increasing the PRP 460 may continue and the algorithm shall not proceed in direction 470 until BER(PRP)<BERlimit, BER(PRP+1 increment)<BERlimit, and BER(PRP+2 increments)<BERlimit. The PRPs may be averaged in procedure 480.

Figure 6:
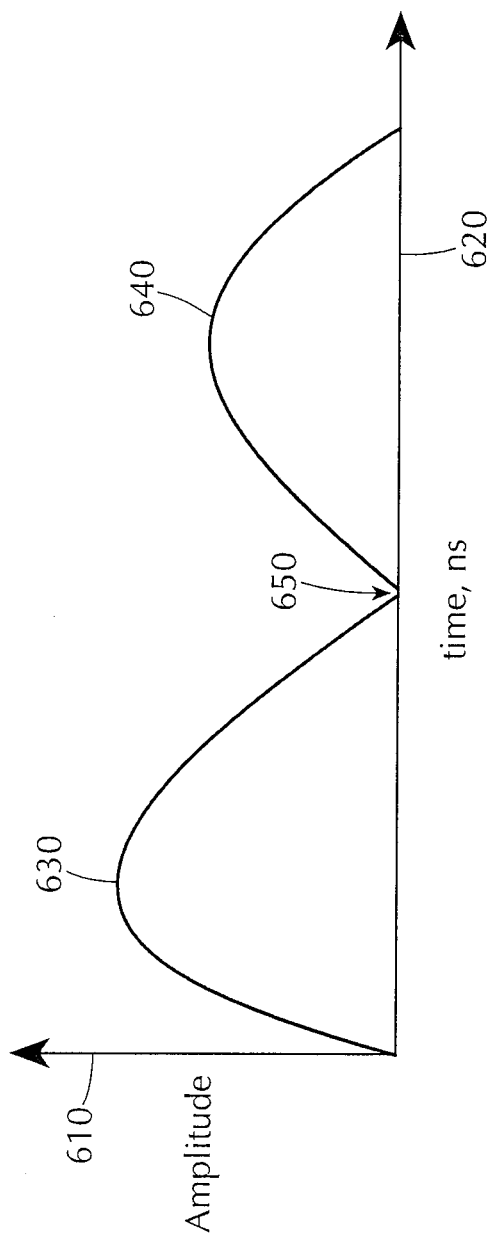
FIG. 6 shows a conceptual drawing representative of channel response within a computer chassis.

In an alternative embodiment, the PRP may be set to a high PRP known to have a low BER and then the PRP may be reduced accordingly. As shown in FIG. 6, most PRP systems have essentially two primary areas of interference with a trough in between where the PRP is optimized. The initially proposed method above will identify the first stable PRP area that provides for the highest bit rate possible. This method works from a high bit rate to a low bit rate (or a low PRP to a high PRP) so the first area identified will have the highest bit rate possible within the BER. To work from high PRP to low PRP the first peak of high error rate must be passed in order to find the next trough having an acceptable area rate and higher speed or lower PRP. To ensure that the optimal trough is found the algorithm needs to first store the PRP before the first BER increase and then continue to teach for another area of low BER that meets the requirement for the BER limit. If that area is found then the PRP for this area should be set to be the PRP for the system. If not, then the originally set PRP should be kept. In short, the procedure may be written as follows: if BER is less than the limit of BER, then set the optimal PRP to the corresponding PRP, if not, increment the PRP and test again. The testing continues until a minimum PRP is achieved. This procedure is further complicated by the requirement that the slope of the BER on either side of the selected PRP be relatively constant so that slight variability in the PRP due to actual arrival times of signals still has an error rate that is under the acceptable BER. Also, instead of setting the PRP to the impulse duration as in the previous method, the initial PRP must be set to a multiple of the impulse duration such as 5 or 10 times. This multiple of impulse duration may be greater or smaller, depending on predicted characteristics of the environment. Since for the examples described herein, 500 Mbps is known to be the maximum bit rate and 125 Mbps is known to be a safe bit rate it terms of meeting the BERlimit, a PRP of 10 ns will generally applicable. In some alternatives this may be set slightly lower. This is equivalent to 5 times the impulse duration. Therefore, the first proposed method is thought to be more optimal.

Figure 5:
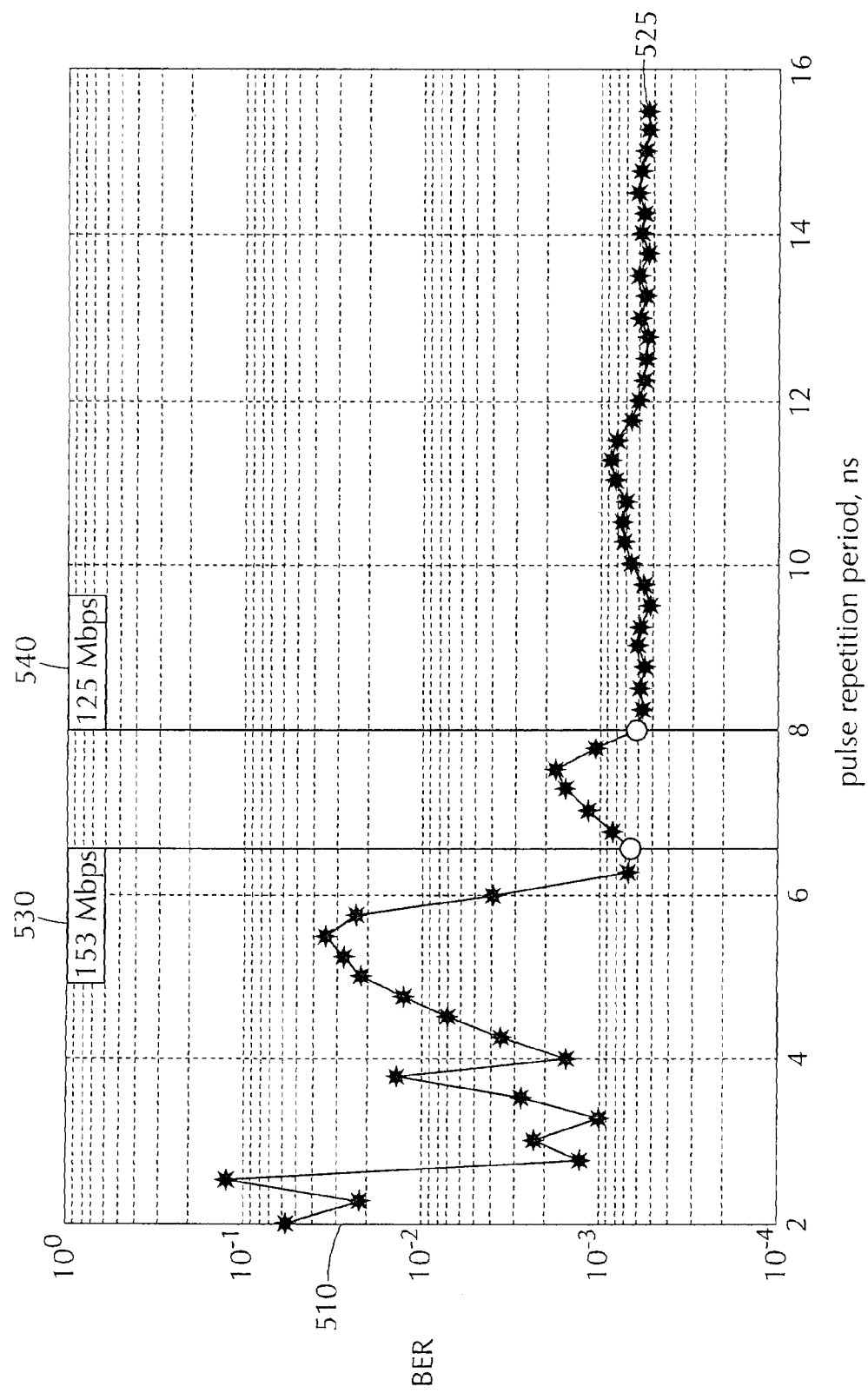
FIG. 5 shows an example of measured receiver BER versus PRP.

The result PRP is set at startup and preferably does not change during system operation. FIG. 5 shows measured receiver BER (y-axis 510) versus PRP (x-axis 520). Notice that this function 525 looks like channel response shape. Also, this graph shows that the required BER is achieved if the PRP is about 6.5 ns. Flag 530 shows what is thought to be the optimum bit rate of 153 Mbps as compared to what would be the default bit rate of 125 Mbps, denoted by flag 540.

Due to technical specialties of WCAN transmitter, PRP should preferably be chosen as a multiple of carrier period. This is because both systems utilize the same oscillator. Consequently, the data rate in the system reaches 153 Mbps. This data rate was chosen because in the nearest points BER<10-3 can also be achieved, so small synchronization error won't be critical. Thus the proposed method gives a gain of data rate 153/125=22.4%. This aspect may be further integrated into the optimization scheme. Essentially, the process shown in FIG. 4 may only pass to procedure 480 if multiple PRPs clustered together can be determined. Essentially, the microprocessor will store the first PRP with a BER below the limit, again increase the PRP and check if the BER is below the limit for the second PRP. The PRP can be then increased again and it is determined whether the third PRP. If all three PRPs have BER that are below the limit, then the average (the second PRP) is selected as the optimal one.

Figure 4:
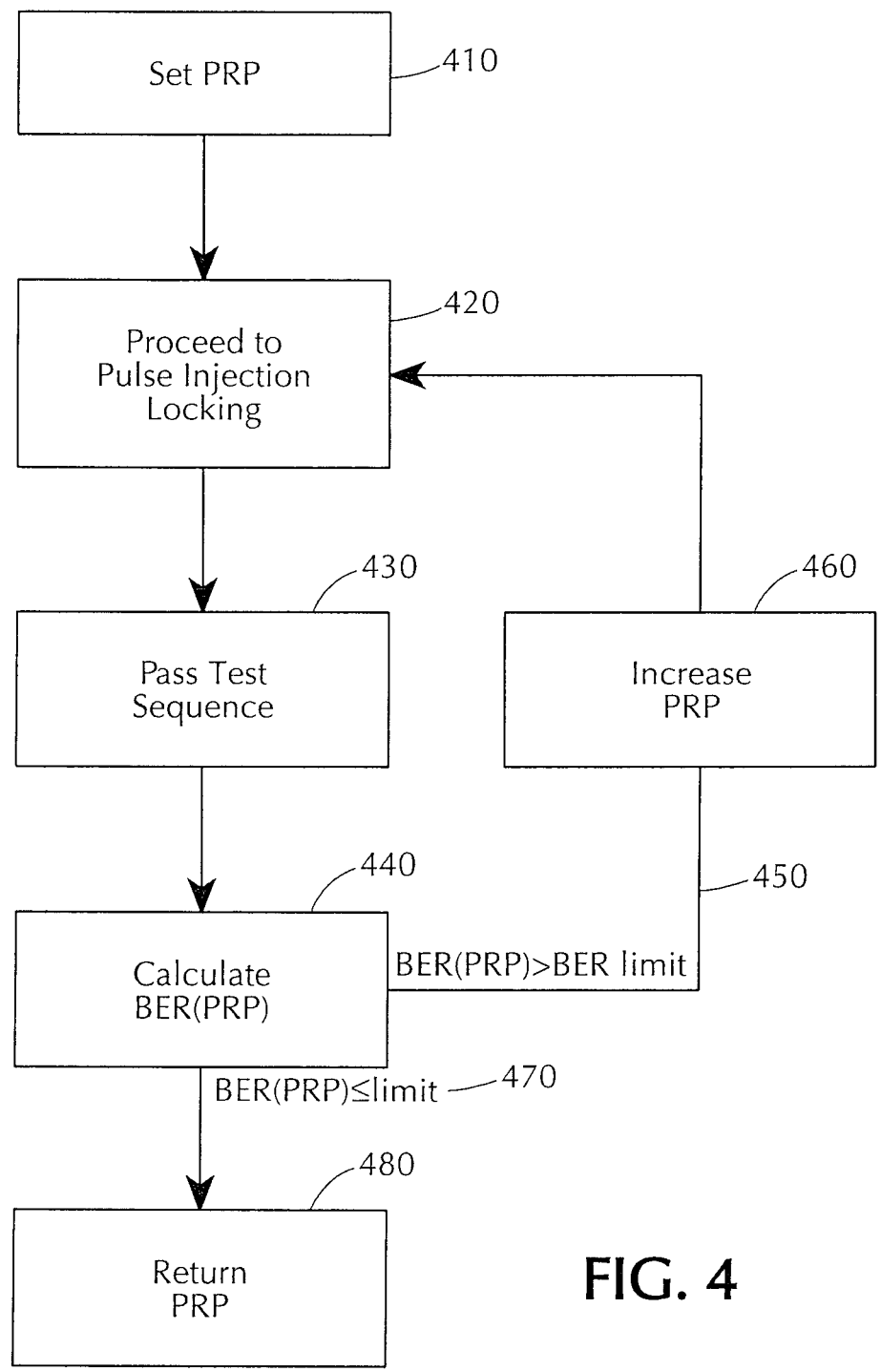
FIG. 4 show a method of optimizing the pulse repetition period (PRP) in an ILPRP system.

In such a procedures, the above algorithm shown in FIG. 4 may be further refined in some alternatives. If a first possible PRP is determined by BER(PRP)<BERlimit, then that PRP may be stored and then again incremented. If the incremented PRP also meets BER(PRP)≤BERlimit then the two may be averaged and the actual PRP set to the point between them. This ensures the PRP will fall into a trough where the all of the BERs for PRP surrounding the selected PRP are less than the limit. This procedure may be also modified to require three or more PRPs to have BER below the limit and then provide for an averaging or selection of the Median, since the PRP can only be a multiple of the carrier period.

FIG. 6 shows a conceptual drawing representative of actual data that might be collected similar to FIG. 2. Similar to FIG. 2 the y-axis 610 relates to the amplitude and the x-axis 620 to the time (related to the PRP). As shown in the FIG. 6, the amplitudes essentially fall into two groups 630, 640. On the right side of group 640, the BER would be acceptable; however the time or PRP would be very long. Instead, the optimal setting for the time is at point 650, the trough between the two groups. Essentially, the described methodologies make it possible to find this trough. Alternative, procedures will be apparent to those skilled in the art.

In one embodiment, a solution is to use Using Pulse Injection-Locking and determine the constant response of the channel. The constant response can be determined since the environment in which WCAN devices are deployed are typically static and the causes of interference, reflection, and delay of signals do not change. The determination of a constant response channel can be used to increase the data rate of inter-chip communication systems, WCAN, etc.

In one embodiment, a method for determining an optimal pulse repetition period (PRP) in a system including a wireless transmission device includes providing a first and second an injection-locked transmission system (110, 120) (ILT system). The method further includes implementing an algorithm in a microprocessor (115) within the first ILT system. The algorithm includes:

synchronizing a receiver clock in the second ILT system with the clock of the first ILT system (420); setting the PRP equal to an impulse duration (410); increasing the PRP (460) until a bit error rate (BER) at the PRP is less than the bit error rate limit (470); and based on the determining that the BER is less than the bit error rate limit, setting the PRP as the optimal PRP (480). Optionally, the method includes determining that a BER of PRPs slightly more that the optimal PRP and PRPs slightly less that the optimal PRP also have a BER less than the bit error rate limit, wherein the determining is occurs before the setting.

Figure 7:
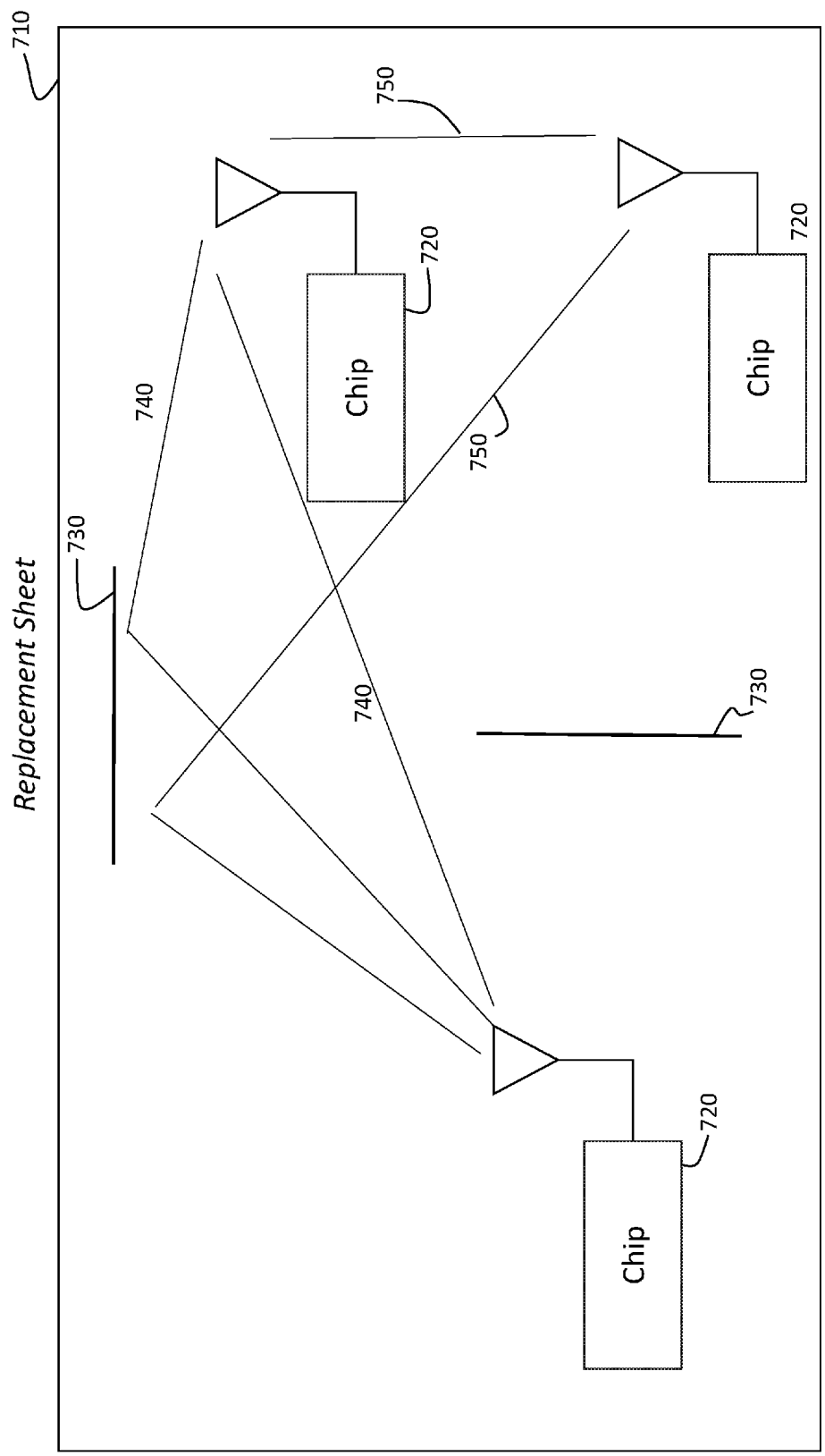
FIG. 7 shows one embodiment of a system including multiple injection-locked pulse repetition period (ILPRP) optimized system.

FIG. 7 shows an embodiment of a system incorporating chips including WCAN transceivers. The chips 720 may be located in an enclosure 710 such as a computer chassis. Inside of the enclosure, various transmission barriers 730 may exist which limit the paths of travel for signals from one chip 720 to another. This may also cause direct signals 740 to be transmitted, as well as indirect or reflected signals 750 (also referred to as a multi-path). The various transmission barriers 730 and indirect signals 750 make the usage of pulse injection locking valuable. This is an example of a configuration in which the determination of the optimal transmission rate according to the method and systems herein may operate.

In one embodiment a method for determining an optimal pulse repetition period (PRP) in a system including a wireless transmission device includes providing a first and second an injection-locked transmission system (110, 120) (ILT system). The method further includes identifying an optimal PRP (650) for transmissions using an algorithm executed in a computing system where a bit error rate (BER) of the PRP is less than a bit error rate limit (470) and the PRP is between two areas of PRPs (630, 640) having BERs less than the bit error rate limit, by sending signals from the first ILT system to the second ILT system. Optionally, the identifying includes implementing the algorithm in a microprocessor (115) within the first ILT system. In one alternative, the algorithm includes the following procedures: synchronizing a receiver clock in the second ILT system with a clock of the first ILT system (420); setting the PRP equal to an impulse duration (410); increasing the PRP until the BER at the PRP is less than the bit error rate limit (470); based on the determining that the BER is less than the bit error rate limit, setting the PRP as the optimal PRP(480). Optionally, the method includes determining that a BER of PRPs slightly more that the optimal PRP and PRPs slightly less that the optimal PRP also have a BER less than the bit error rate limit, wherein the determining is occurs before the setting. In one alternative, the algorithm includes: synchronizing a receiver clock in the second ILT system with a clock of the first ILT system (410); setting the PRP equal to an impulse duration (420); increasing the PRP (460) until the BER at three consecutive PRPs is less than the bit error rate limit (470); and based on the determining that the BER is less than the bit error rate limit, setting an average of the three consecutive PRPs as the optimal PRP (480). Optionally, the first ILT system includes a transmitter (110) and the transmitter includes a pseudo-random binary sequence transmitter (120), a non-return to zero to return to zero data converter (125), a variable pulse window (130), an injection locked voltage control oscillator (135), a frequency divider (140), a combiner (145), and an antenna (150). In one configuration, the first ILT system includes a receiver (120) and the receiver includes a receiver antenna (155), a receiver pulse injection locking system (157), including a low noise amplifier (160), a variable amplifier (161), and an injection locked voltage control oscillator (135), a phase shifter (165), a divider (140) and analog to digital converter (170). Optionally, the algorithm includes the following: synchronizing a receiver clock in the second ILT system with a clock of the first ILT system; setting the PRP equal to at least five times an impulse duration; decreasing a first time the PRP until the BER at the PRR is greater than the bit error rate limit; decreasing a second time the PRP until the BER at the PRR is less than the bit error rate limit; and based on the determining that the BER is less than the bit error rate limit after decreasing the PRP the first time, setting the PRP as the optimal PRP. In one alternative, the PRP is a multiple of a carrier period of the transmissions.

In one embodiment, a system including a microprocessor having a wireless transmission module, the microprocessor designed to operate in a wide chip area network system (WCAN system) includes an injection-locked transmission system (ILT system) (110, 120). The microprocessor includes an algorithm configured to identify a pulse repetition period (PRP) (650) for transmissions using the ILT system where a bit error rate (BER) of the PRP is less than a bit error rate limit and the PRP is between two areas of PRPs (630, 640) having BERs less than the bit error rate limit, by sending signals from the ILT system to the a remote ILT system. Optionally, the algorithm includes instructions for synchronizing a receiver clock in the remote ILT system with a clock of the ILT system (420); setting the PRP of the ILT system equal to an impulse duration (410); increasing the PRP (460) until the BER at the PRP is less than the bit error rate limit (470); and based on the determining that the BER is less than the bit error rate limit, setting the PRP as the optimal PRP (480). In one alternative, the algorithm includes instructions for determining that a BER of PRPs slightly more that the optimal PRP and PRPs slightly less that the optimal PRP also have a BER less than the bit error rate limit, wherein the determining is occurs before the setting. In another alternative, the algorithm includes instructions for synchronizing a receiver clock in the remote ILT system with a clock of the ILT system (420); setting the PRP of the ILT system equal to an impulse duration (410); increasing the PRP(460) until the BER at three consecutive PRPs is less than the bit error rate limit (470); and based on the determining that the BER is less than the bit error rate limit, setting an average of the three consecutive PRPs as the optimal PRP (480). Optionally, the algorithm includes instructions for synchronizing a receiver clock of the remote ILT system with a clock of the ILT system; setting the PRP equal to an impulse duration, the PRP being very long; decreasing a first time the PRP until the BER at the PRR is greater than the bit error rate limit; decreasing a second time the PRP until the BER at the PRR is less than the bit error rate limit; and based on the determining that the BER is less than the bit error rate limit after decreasing the PRP the first time, setting the PRP as the optimal PRP. In one configuration, the ILT system includes a transmitter (110) and the transmitter includes a pseudo-random binary sequence transmitter (120), a non-return to zero to return to zero data converter (125), a variable pulse window (130), an injection locked voltage control oscillator (135), a frequency divider (140), a combiner (145), and an antenna (150). In another configuration, the first ILT system includes a receiver (120) and the receiver includes a receiver antenna (155), a receiver pulse injection locking system (157), including a low noise amplifier (160), a variable amplifier (161), and an injection locked voltage control oscillator (135), a phase shifter (165), a divider (140) and analog to digital converter (170). Alternatively, the PRP is a multiple of a carrier period of transmissions.

The previous detailed description is of a small number of embodiments for implementing the injection-locked pulse repetition period optimized system (ILPRPO system) and is not intended to be limiting in scope. It should be understood that the various elements and procedures can be combined differently and/or replaced with equivalent elements and procedures. Procedures may be performed in a different order. It will also be evident to those skilled in the art that the various parts of the ILPRPO system may be combined in many different ways. It should be understood that each of the elements and procedures described can be combined with any of the other elements and procedures. The following claims set forth a number of the embodiments of the injection-locked pulse repetition period optimized system (ILPRPO system) disclosed with greater particularity.

The invention claimed is:

1. A method for determining an optimal pulse repetition period (PRP) in a system including a wireless transmission device, the method comprising the steps of:
   providing a first and second injection-locked transmission (ILT) system;
   implementing an algorithm in a microprocessor within the first ILT system, the algorithm including:
      synchronizing a receiver clock in the second ILT system with the clock of the first ILT system;
      setting a pulse repetition period (PRP) equal to an impulse duration;
      increasing the PRP until a bit error rate (BER) at the PRP is less than a bit error rate limit; and
      based on the determining that the BER is less than the bit error rate limit, setting the PRP as the optimal PRP.

2. The method of claim 1, further comprising: determining that a BER of PRP is slightly more that an optimal PRP and the PRP is slightly less that the optimal PRP also have a BER less than the bit error rate limit, and wherein the determining step occurs before the setting step.

3. A method for determining an optimal pulse repetition period (PRP) in a system including a wireless transmission device, the method comprising the steps of:
   providing a first and second injection-locked transmission (ILT) system; and
   identifying an optimal PRP for transmissions using an algorithm executed in a computing system where a bit error rate (BER) of the PRP is less than a bit error rate limit and the PRP is between two areas of PRPs having BERs less than the bit error rate limit, by sending signals from the first ILT system to the second ILT system.

4. The method of claim 3, wherein the identifying includes implementing the algorithm in a microprocessor within the first ILT system.

5. The method of claim 4, wherein the algorithm includes: synchronizing a receiver clock in the second ILT system with a clock of the first ILT system; setting the PRP equal to an impulse duration; increasing the PRP until the BER at the PRP is less than the bit error rate limit; and based on the determining that the BER is less than the bit error rate limit, setting the PRP as the optimal PRP.

6. The method of claim 5, further comprising: determining that a BER of PRPs slightly more that the optimal PRP and PRPs slightly less that the optimal PRP also have a BIER less than the bit error rate limit, wherein the determining step occurs before the setting step.

7. The method of claim 4, wherein the algorithm includes the following:
   synchronizing a receiver clock in the second ILT system with a clock of the first ILT system;
   setting the PRP equal to an impulse duration; increasing the PRP until the BER at three consecutive PRPs is less than the bit error rate limit; and
   based on the determining that the BER is less than the bit error rate limit, setting an average of the three consecutive PRPs as the optimal PRP.

8. The method of claim 4, wherein the algorithm includes:
   synchronizing a receiver clock in the second ILT system with a clock of the first ILT system;
   setting the PRP equal to at least five times an impulse duration;
   decreasing a first time the PRP until the BER is greater than the bit error rate limit;
   decreasing a second time the PRP until the BER is less than the bit error rate limit; and
   based on the determining that the BER is less than the bit error rate limit after decreasing the PRP the first time, setting the PRP as an optimal PRP.

9. The method of claim 3, wherein the first ILT system includes a transmitter and the transmitter includes a pseudo-random binary sequence transmitter, a non-return to zero to return to zero data converter, a variable pulse window, an injection locked voltage control oscillator, a frequency divider, a combiner, and an antenna.

10. The method of claim 3 wherein the first ILT system includes a receiver and the receiver includes a receiver antenna, a receiver pulse injection locking system, including a low noise amplifier, a variable amplifier, and an injection locked voltage control oscillator, a phase shifter, a divider and analog to digital converter.

11. The method of claim 3, wherein the PRP is a multiple of a carrier period of the transmissions.

12. A system including a microprocessor having a wireless transmission module, the microprocessor designed to operate in a wide chip area network (WCAN), the system comprising:
   an injection-locked transmission system (ILT system), wherein the microprocessor includes an algorithm configured to identify a pulse repetition period (PRP) for transmissions using the ILT system where a bit error rate (BER) of the PRP is less than a bit error rate limit and the PRP is between two areas of PRPs having BERs less than the bit error rate limit, by sending signals from the ILT system to a remote ILT system.

13. The system of claim 12, wherein the algorithm includes instructions for synchronizing a receiver clock in the remote ILT system with a clock of the ILT system; setting the PRP of the ILT system equal to an impulse duration; increasing the PRP until the BER at the PRP is less than the bit error rate limit; and based on the determining that the BER is less than the bit error rate limit, setting the PRP as the optimal PRP.

14. The system of claim 13, wherein the algorithm includes instructions for determining that a BER of PRPs slightly more that the optimal PRP and PRPs slightly less that the optimal PRP also have a BER less than the bit error rate limit, wherein the determining step occurs before the setting step.

15. The system of claim 12, wherein the algorithm includes instructions for synchronizing a receiver clock in the remote ILT system with a clock of the ILT system; setting the PRP of the ILT system equal to an impulse duration; increasing the PRP until the BER at three consecutive PRPs is less than the bit error rate limit; based on the determining that the BER is less than the bit error rate limit, setting an average of the three consecutive PRPs as the optimal PRP.

16. The system of claim 12, wherein the algorithm includes instructions for
synchronizing a receiver clock of the remote ILT system with a clock of the ILT system;
setting the PRP equal to an impulse duration;
decreasing a first time impulse duration of the PRP until the BER is greater than the bit error rate limit;
decreasing a second time the PRP until the BER is less than the bit error rate limit; and
based on the determining that the BER is less than the bit error rate limit after decreasing the PRP the first time, setting the PRP as an optimal PRP.

17. The system of claim 12, wherein the ILT system includes a transmitter and the transmitter includes a pseudo-random binary sequence transmitter, a non-return to zero converter, a variable pulse window, an injection locked voltage control oscillator, a frequency divider, a combiner, and an antenna.

18. The system of claim 12, wherein the remote ILT system includes a receiver and the receiver includes a receiver antenna; a receiver pulse injection locking system), including a low noise amplifier, a variable amplifier, and an injection locked voltage control oscillator, a phase shifter, a divider and an analog to digital converter.

19. The system of claim 12, wherein the PRP is a multiple of a carrier period of transmissions.

* * * * *